United States Patent [19]
Gonzalez et al.

[11] Patent Number: 6,005,273
[45] Date of Patent: *Dec. 21, 1999

[54] TRANSISTORS HAVING CONTROLLED CONDUCTIVE SPACERS, USES OF SUCH TRANSISTORS AND METHODS OF MAKING SUCH TRANSISTORS

[75] Inventors: Fernando Gonzalez, Boise; David Kao, Meridian, both of Id.

[73] Assignee: Micron Technology, Inc., Boise, Id.

[*] Notice: This patent is subject to a terminal disclaimer.

[21] Appl. No.: 08/987,819

[22] Filed: Dec. 10, 1997

Related U.S. Application Data

[63] Continuation-in-part of application No. 08/741,828, Oct. 31, 1996, Pat. No. 5,714,786.

[51] Int. Cl.⁶ .......................... H01L 29/78; H01L 27/108
[52] U.S. Cl. .......................... 257/366; 257/296; 257/344; 257/42
[58] Field of Search .................................. 257/296, 344, 257/365–367

[56] References Cited

U.S. PATENT DOCUMENTS

| | | | |
|---|---|---|---|
| 4,213,139 | 7/1980 | Rao | 257/366 |
| 4,319,263 | 3/1982 | Rao | 257/366 |
| 4,472,821 | 9/1984 | Mazin et al. | 257/366 |
| 4,975,385 | 12/1990 | Beinglass et al. | |
| 5,115,288 | 5/1992 | Manley . | |
| 5,250,450 | 10/1993 | Lee et al. | |
| 5,252,504 | 10/1993 | Lowrey et al. | |
| 5,257,238 | 10/1993 | Lee et al. | |
| 5,292,681 | 3/1994 | Lee et al. | |
| 5,324,960 | 6/1994 | Pfiester et al. | |
| 5,397,727 | 3/1995 | Lee et al. | |
| 5,425,392 | 6/1995 | Thakur et al. | |
| 5,439,835 | 8/1995 | Gonzalez . | |
| 5,495,441 | 2/1996 | Hong . | |
| 5,513,137 | 4/1996 | Lee et al. | |
| 5,600,168 | 2/1997 | Lee | 257/366 |
| 5,714,786 | 2/1998 | Gonzalez et al. | 257/366 |

OTHER PUBLICATIONS

Tiao–yuan Huang, William W. Yao, Russell A. Martin, Alan G. Lewis, Mitsumasa Koyanagi, & John Y. Chen, A Novel Submicron LDD Transistor with Inverse–T Gate Structure, IDEM 1986, pp. 742–745.

I. C. Chen, J. P. Lin, and C. W. Teng, Article from 1990 Symposium on VLSI Technology entitled: "A Highly Reliable 0.3 μm N–channel MOSFET Using Poly Spacers", pp. 39–40.

Masataka Minami, Yasuo Sawahata, Hiroshi Matsuki and Takahiro Nagano, Article from 1990 Symposium on VLSI Technology entitled: A High Speed & High Reality MOFSET Utilizing an Auxiliary Gate, pp. 41–42.

F.–C. Hsu and K.–Y. Chiu, Article from IEEE Electron Device Letters, vol. EDL–5, No. 5, entitled: Evaluation of LDD MOSFET's Based on Hot–Electron–Induced Degradation, May 1984, pp. 162–165.

*Primary Examiner*—Gene M. Munson
*Attorney, Agent, or Firm*—Killworth, Gottman, Hagan & Schaeff, LLP

[57] ABSTRACT

A transistor structure includes an insulated conductive gate spacer or a conductive layer under a nonconductive spacer, together forming a composite spacer, which contacted and driven separately from the conventional gate of the transistor. The gate spacer, conductive layer of a composite spacer or a portion or portions thereof serve as a control or controls for the transistors taking the form of a second gate or second and third gates for the transistors. The transistors may be used throughout an integrated circuit or it may be preferred to use the improved transistor only in critical speed paths of an integrated circuit. Delays within circuits including the improved transistors are reduced since the drain voltage can be higher than VCC and the BVDSS and subthreshold voltage are substantially higher than standard LDD transistors. When the improved transistors are used selectively within an integrated circuit, the remaining devices can be structured as standard LDD transistors, using the gate spacers in a conventional manner, and/or as conventional transistors.

12 Claims, 5 Drawing Sheets

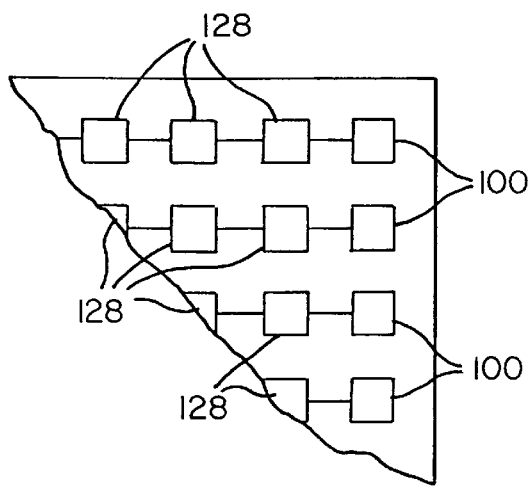
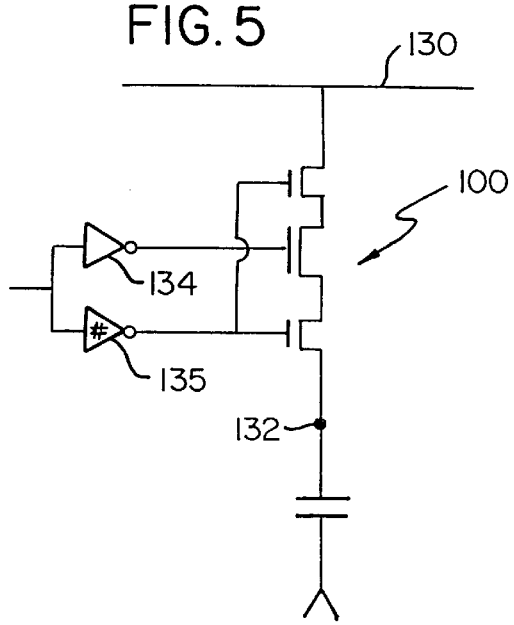
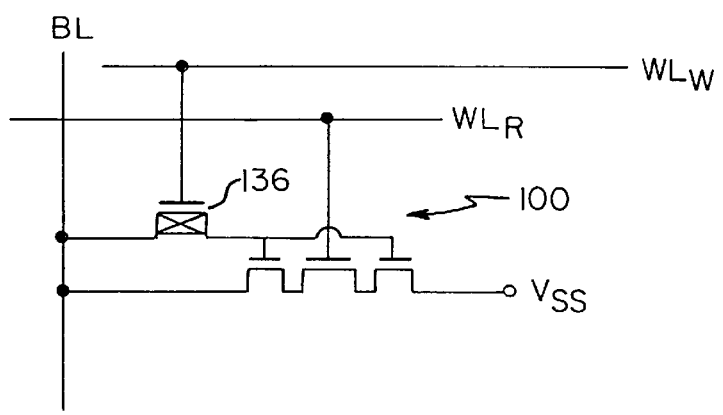

TRANSISTORS HAVING CONTROLLED
CONDUCTIVE SPACERS, USES OF SUCH
TRANSISTORS AND METHODS OF MAKING
SUCH TRANSISTORS

CROSS-REFERENCE TO RELATED
APPLICATIONS

This application is a continuation-in-part of U.S. patent application Ser. No. 08/741,828, filed Oct. 31, 1996, now U.S. Pat. No. 5,714,786, issued Feb. 3, 1998, and entitled TRANSISTORS HAVING CONTROLLED CONDUCTIVE SPACERS, USES OF SUCH SPACERS AND METHODS OF MAKING SUCH TRANSISTORS the disclosure of which is hereby incorporated by reference.

BACKGROUND OF THE INVENTION

The present invention relates in general to transistor structures and, more particularly, to improved transistor structures, their uses and methods for making them wherein an insulated conductive gate spacer or an insulated conductive portion of a gate spacer is contacted and driven separately from the gate.

The use of lightly doped drain (LDD) regions in very large scale integrated (VLSI) metal oxide semiconductor (MOS) integrated circuit structures is well known to overcome electric field effects near the drain region which can cause short channel effects, punchthrough and hot carrier degradation. The formation of such LDD regions between the channel and the more heavily and deeper doped conventional drain region spreads out the electric field which mitigates short-channel effects, reduces hot carrier generation and increases the punchthrough breakdown voltage.

Spacers formed on the sidewalls of the gate electrodes of MOS transistors have been utilized in the formation of LDD regions. Both electrically nonconducting, typically oxide, spacers and electrically conducting spacers have been used; however, the spacers normally are not connected to a defined potential such that they float within the MOS structure including the transistors. When conductive spacers have been used for operation of an MOS transistor, they have served as an extension of the gate electrode upon which they are formed.

While LDD transistors are an improvement over conventional MOS transistors, LDD transistors also have disadvantages in their own right. For example, transistor drive current is reduced in LDD transistors due to the transistor series resistance of the LDD regions.

Accordingly, there is an ongoing need for improved transistor structures which can be used to improve various characteristics of standard LDD transistors, for example, the transistor drive current and gate delays of logic circuits including the improved transistors. Preferably, the improved transistors could be used together with or in place of conventional transistors and/or standard LDD transistors in an integrated circuit. Such an improved transistor structure should provide higher breakdown voltage from drain to source side (BVDSS) and higher subthreshold voltages.

SUMMARY OF THE INVENTION

This need for improvement over existing LDD transistors is met by the invention of the present application wherein an insulated conductive gate spacer or a conductive layer under a nonconductive spacer, together forming a composite spacer, is formed on a transistor, contacted and driven separately from the conventional gate of the transistor. The gate spacer, conductive layer of a composite spacer or a portion or portions thereof serve as control for the transistor taking the form of a second gate or second and third gates for the transistor. Transistors of the present invention may be used throughout an integrated circuit or it may be preferred to use the improved transistors only in critical speed paths of an integrated circuit. Delays within circuits including the improved transistors are reduced since the drain voltage can be higher than VCC and the BVDSS and subthreshold voltage are substantially higher than standard LDD transistors. When the improved transistors are used selectively within an integrated circuit, the remaining devices can be structured as standard LDD transistors, using the gate spacers in a conventional manner, and/or as conventional transistors.

Thus, the present invention provides an improved transistor structure which includes an insulated electrically conductive gate spacer or electrically conductive gate spacer portion which is contacted and controlled separately from the gate of the transistor. The improved transistor structure also provides improved transistor drive current and reduced delays within integrated circuits including the improved transistors. The improved transistor structure can be used together with LDD transistors and other conventional transistors at least, for example, in critical speed paths. The present invention also provides uses for the improved transistor structure and methods for making it, and uses for the combined LDD/conventional and improved transistor structures and methods for making the combined LDD/conventional and improved transistor structures.

Other features and advantages of the invention will be apparent from the following description, the accompanying drawings and the appended claims.

BRIEF DESCRIPTION OF THE DRAWINGS

FIG. 4 is a schematic illustration of an integrated circuit including transistors of the present invention together with LDD transistors and/or conventional transistors;

FIG. 5 is a schematic illustration of use of a transistor of the present invention in a dynamic random access memory (DRAM);

FIG. 6 is a schematic illustration of use of a transistor of the present invention in a semi-static low power DRAM cell;

DETAILED DESCRIPTION OF THE INVENTION

Figure 1:
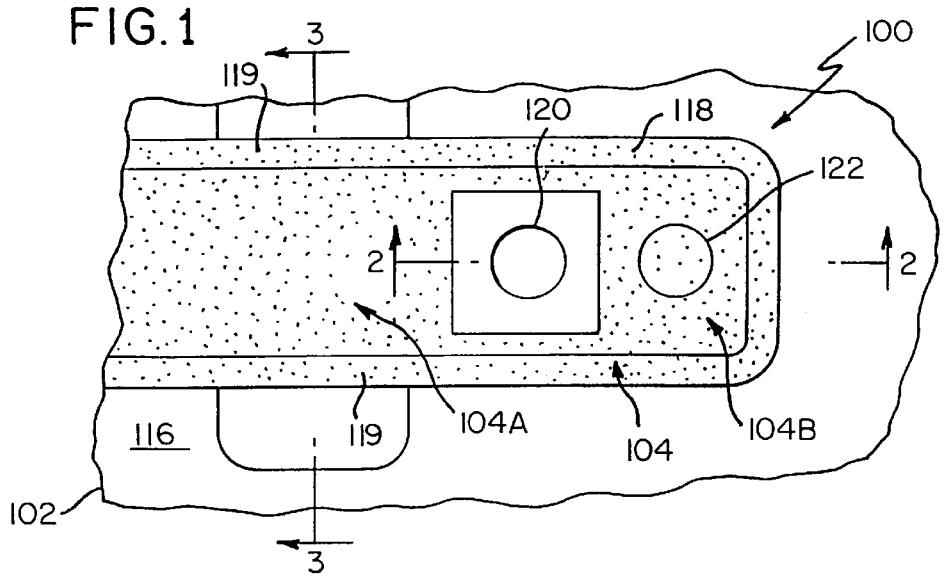
FIG. 1 is a fragmentary plan view of a first embodiment of an improved transistor made in accordance with the present invention.
Figure 2:
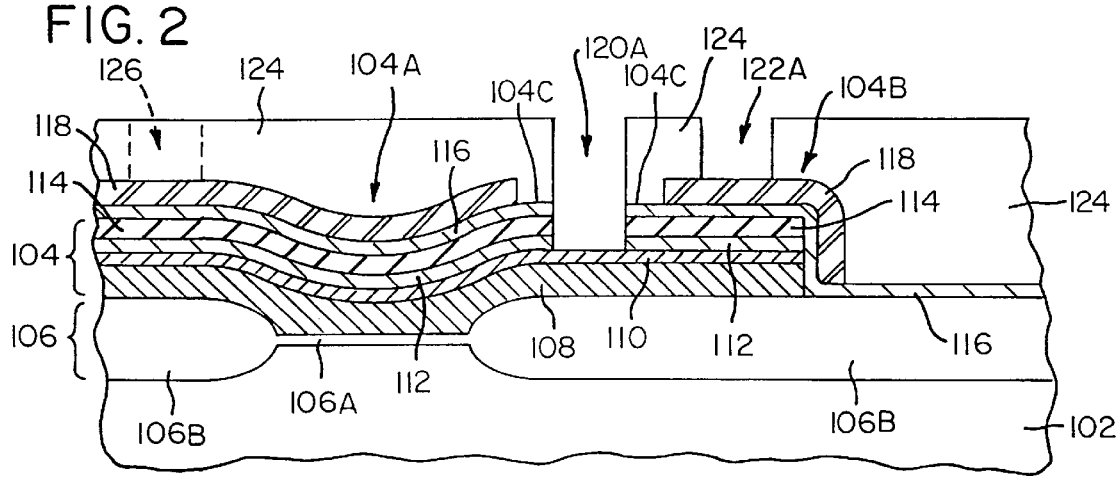
FIG. 2 is a fragmentary sectional view of the improved transistor of FIG. 1 taken along section line 2—2.
Figure 3:
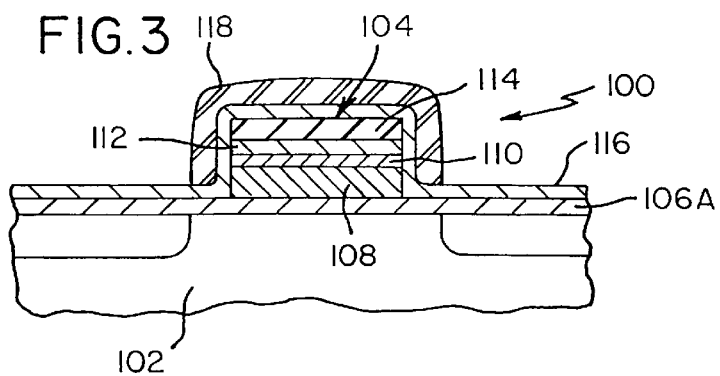
FIG. 3 is a fragmentary sectional view of the improved transistor of FIG. 1 taken along section line 3—3.

An improved transistor 100 or multiple gate transistor including the structure of a first embodiment and made in accordance with the invention of the present application is shown in FIGS. 1–3. The transistor 100 is formed on a base layer or semiconductor structure 102 which can be one or more semiconductor layers or structures and includes active or operable portions of semiconductor devices. The semiconductor structure 102 is formed of silicon in the illustrated embodiment although the invention is applicable to other semiconductor materials. A gate structure 104 is formed on a first oxide layer 106 formed on the semiconductor structure 102. The gate structure 104 is illustrated as a multilayer gate stack which may be formed for an array device for which the present invention is initially being used. However, other gate structures can be used and are considered to be within the scope of the present invention.

The first oxide layer 106 includes thin gate oxide regions represented by the region 106A defining active regions of the structure and substantially thicker field oxide regions 106B defining isolation regions. As illustrated, local oxidization of silicon (LOCOS) isolation is utilized; however, it is noted that the invention can be utilized with other well known isolation technologies as will be apparent.

The multilayer gate stack comprises a polysilicon gate layer 108, a silicided polysilicon layer 110, an oxide layer 112 and a nitride layer 114. A secondary oxide layer 116 is formed on the gate structure 104. The secondary oxide layer 116 may be formed, for example, by a chemical vapor deposition (CVD) of tetraethyl orthosilicate (TEOS) or rapid thermal processor (RTP) oxide (RTO). A conductive gate spacer 118 is formed around the gate structure 104 on the secondary oxide layer 116 with the conductive gate spacer 118 being removed from a portion 104C of the gate structure 104 to form an aperture in the spacer 118. The conductive gate spacer 118 can be formed, for example, from titanium silicide ($TiSi_2$).

A first portion 104A of the gate structure 104 serves as a first or actual gate for the transistor 100 while a second portion 104B of the gate structure 104 forms a pseudo gate or conductive spacer connection support to permit separate connection to the conductive gate spacer 118 which serves as a control or second gate 119 for the transistor 100. The portion of the conductive gate spacer 118 which is removed is generally on the top of the first portion 104A of the gate structure 104 and can be removed by the reactive ion etching of the $TiSi_2$ layer which forms the gate spacer 118.

A first contact is made through or by way of the first portion 104A of the gate structure 104 where the conductive gate spacer 118 has been removed, i.e., by passing through an aperture formed in the spacer 118, and a second contact is made to the conductive gate spacer 118. For other isolation arrangements or other embodiments of the transistor of the invention of the present application, the first portion 104A and the second portion 104B of the gate structure 104 may be formed separately from one another.

Contacting areas 120, 122 for the first gate and second gate are shown in FIG. 1 and in FIG. 2 by contact openings 120A, 122A made through a mask 124, not shown in FIGS. 1 and 3 for clarity of illustration. It is also possible to contact the gate spacer 118 over the first portion 104A of the gate structure 104 where the conductive gate spacer 118 has not been removed. Such connection to the gate spacer 118 is illustrated in FIG. 2 where a portion of the conductive gate spacer 118 is shown and a contact opening 126 is illustrated in dotted lines. While only a single transistor 100 is illustrated in the drawings, the gate structure 104 can be common to a number of transistors and can comprise a wordline for an integrated array or storage device.

In one embodiment of the invention, the gate length is 0.1 μm and is electrically isolated from the gate spacer 118 or second gate which is electrically connected to a separate driver. The spacer gate or second gate 119 preferably is formed over the thicker field oxide so that the gate-induced drain leakage (GIDL) effect is not aggravated if the potential on the second gate 119 goes negative in the low off state. Thus, turn off of the transistor 100 can be ensured by use of a negative voltage on the second gate 119. The drive current of the transistor 100 is like a 0.1 μm device but the subthreshold voltage and punchthrough are substantially that of a 0.3 μm device.

The structure of the transistor 100 may be used throughout an integrated circuit; however, it may be preferred to use the structure of the transistor 100 only in critical speed paths of an integrated circuit to gain speed since the drain voltage can be higher than VCC and the BVDSS and subthreshold voltage are substantially higher. Where the structure of the transistor 100 is used selectively within an integrated circuit, the remaining devices can be structured as standard LDD transistors using the spacers in a conventional manner. Some or all of the remaining devices can also be conventional transistors without spacers, i.e., not LDD transistors or transistors of the present invention. An integrated circuit combining conventional transistors and/or LDD transistors 128 and the transistors 100 is schematically illustrated in FIG. 4 where the transistors 100 can be used to implement output drivers for the integrated circuit. It is also possible to scale down the gate spacer 118 or remove portions of the gate spacer 118 for compaction of the device.

The transistor 100 is initially being used in array devices; however, it should be apparent that the transistor 100 can be used in a large variety of applications to provide the noted improvements in performance. For example, the transistor 100 can be used in a dynamic random access memory (DRAM) as schematically shown in FIG. 5 where the transistor 100 is connected between a data line 130 and a storage node 132 with the first and second gates of the transistor 100 being driven by rowline drivers 134,135, respectively. The voltage swing between off and on for the first gate controlled by the driver 134 can be less than the swing between off and on for the second gate controlled by the driver 135. In this way, it is possible to turn off the second gate by driving it to a negative potential and to turn on the second gate by driving it to a potential higher than the on potential for the first gate.

In another example schematically shown in FIG. 6, the transistor 100 is used in a semi-static low power DRAM cell as the nMOS read transistor with the parasitic capacitances of the spacer gates or spacer transistors being used for storage, and a pMOS transistor 136 being used as the write transistor for the cell. In FIGS. 5 and 6, the spacer gate or second gate 119 of the transistor 100 is illustrated as two smaller gates to either side of the first gate of the transistor 100 as should be apparent from the foregoing description.

While methods of making the transistor 100 of the present application are apparent from the foregoing description, for sake of clarity a basic method will be briefly outlined. A method of making the transistor 100 comprises forming a gate structure on a first oxide layer on a semiconductor structure and a secondary oxide layer on the gate structure. A conductive spacer is formed around the gate structure on the secondary oxide layer and the conductive spacer is removed from a portion of the gate structure to form an aperture in the spacer. A first contact is formed to the gate structure through or by way of the portion of the gate structure from which the conductive spacer has been removed, i.e. by passing through the aperture in the spacer. And, a second contact is formed to the conductive spacer.

Similarly, a method for making an integrated circuit having conventional LDD transistors and transistors structured as the transistor 100 comprises forming gate structures on a first oxide layer on a semiconductor structure and a secondary oxide layer on the gate structures. Conductive spacers are formed around the gate structures. The conductive spacers are utilized to form LDD transistor structures associated with a first number of the gate structures and to form transistor structures of the present invention associated with a second number of the gate structures. The transistor structures of the present invention are formed by removing the conductive spacer from portions of the second number of gate structures and forming first contacts to the second number of gate structures through the apertures corresponding to the portions of the second number of gate structures from which the conductive spacer has been removed. Second contacts are formed to the conductive spacers. Of course, conventional transistors which are neither LDD nor those of the present invention can also be used in the integrated circuit with the conventional transistors being connected to the LDD transistors and/or the transistors of the present application.

Figure 7:
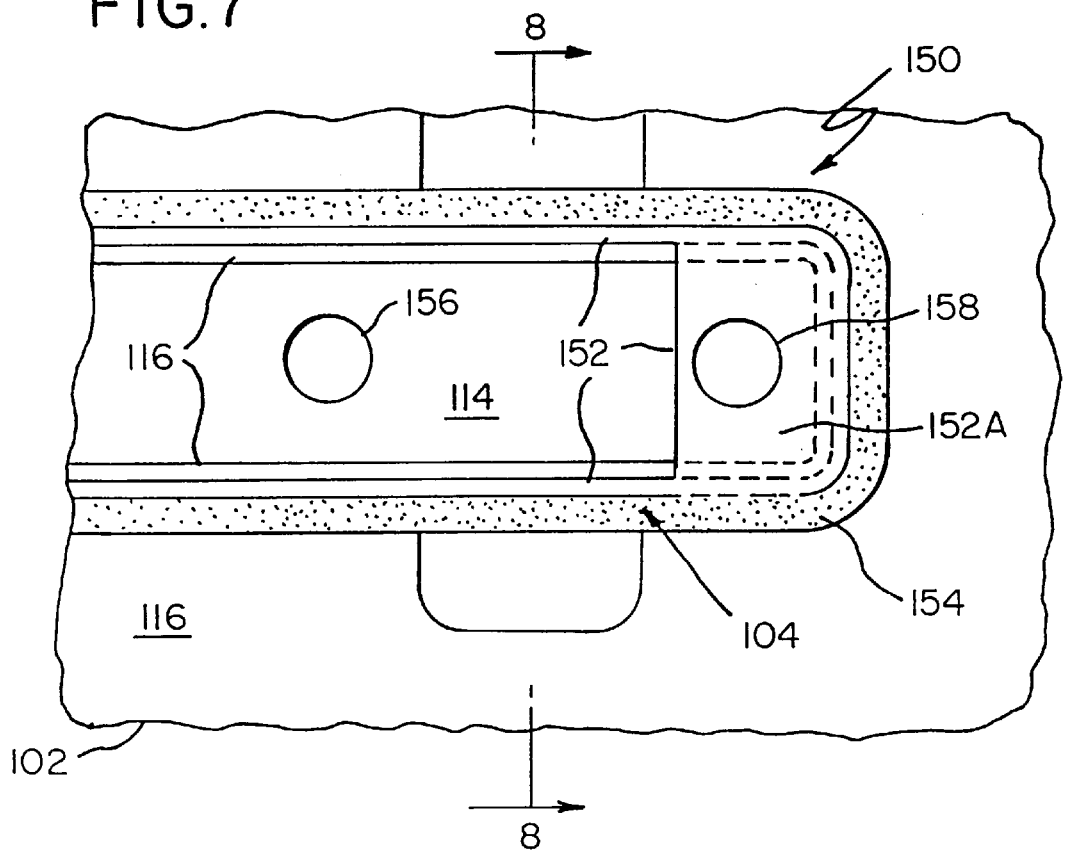
FIG. 7 is a fragmentary plan view of a second embodiment of an improved transistor made in accordance with the present invention.
Figure 8:
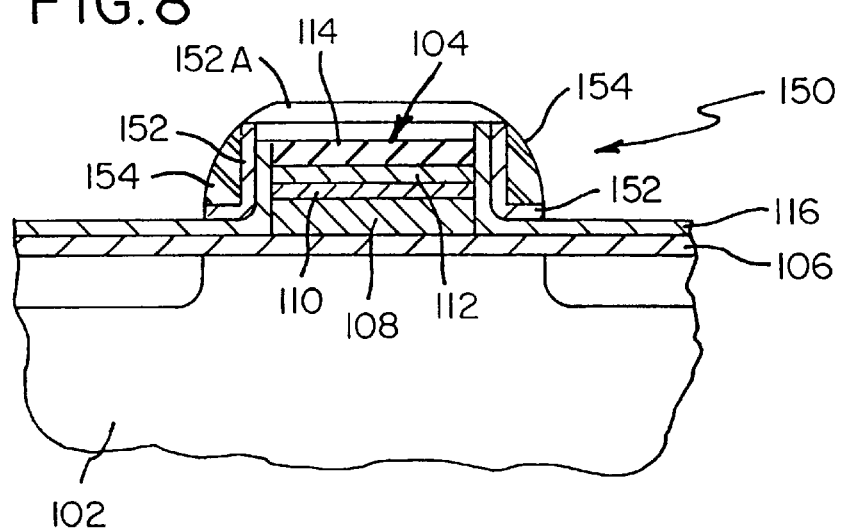
FIG. 8 is a fragmentary sectional view of the improved transistor of FIG. 7 taken along section line 8—8.

An improved transistor 150 including the structure of a second embodiment and made in accordance with the invention of the present application is shown in FIGS. 7 and 8. Structure which is common between the transistor of FIGS. 1–3 and FIGS. 7 and 8 will be labeled with like numbers. The transistor 150 is formed on a base layer or semiconductor structure 102 which can be one or more semiconductor layers or structures and includes active or operable portions of semiconductor devices. The semiconductor structure 102 is formed of silicon in the illustrated embodiment although the invention is applicable to other semiconductor materials. A gate structure 104 is formed on a first oxide layer 106 formed on the semiconductor structure 102. The gate structure 104 is illustrated as a multilayer gate stack which may be formed for an array device for which the present invention is initially being used. However, other gate structures can be used and are considered to be within the scope of the present invention.

The multilayer gate stack comprises a polysilicon gate layer 108, a silicided polysilicon layer 110, an oxide layer 112 and a nitride layer 114. A secondary oxide layer 116 is formed on the gate structure 104. The secondary oxide layer 116 may be formed, for example, by a chemical vapor deposition (CVD) of tetraethyl orthosilicate (TEOS) or rapid thermal processor (RTP) oxide (RTO). A conductive layer 152 is formed around the gate structure 104 on the secondary oxide layer 116 to define a second gate. A nonconductive spacer 154 is formed over the conductive layer 152 with the nonconductive spacer and the conductive layer thereunder forming a composite spacer. Nonconductive spacer material and a portion of the conductive layer 152 are removed to expose the top of the gate structure 102, i.e., the nitride layer 114, thereby forming an aperture in the composite spacer over the gate structure 104.

A first contact is then made to the silicided polysilicon layer 110 in a manner similar to that described above relative to the transistor 100 of FIGS. 1–3, for example, at a contacting area 156. A second contact is made to a portion 152A of the conductive layer 152 which was not removed, for example, at a contacting area 158. The transistor 150 provides the same benefits as the transistor 100 but effectively has a nonconductive spacer which can be advantageous since it imposes less limitations on the area which can be used for metalization to form conductors within an integrated circuit including the transistor 150 and therefor is easier to make.

Figure 9:
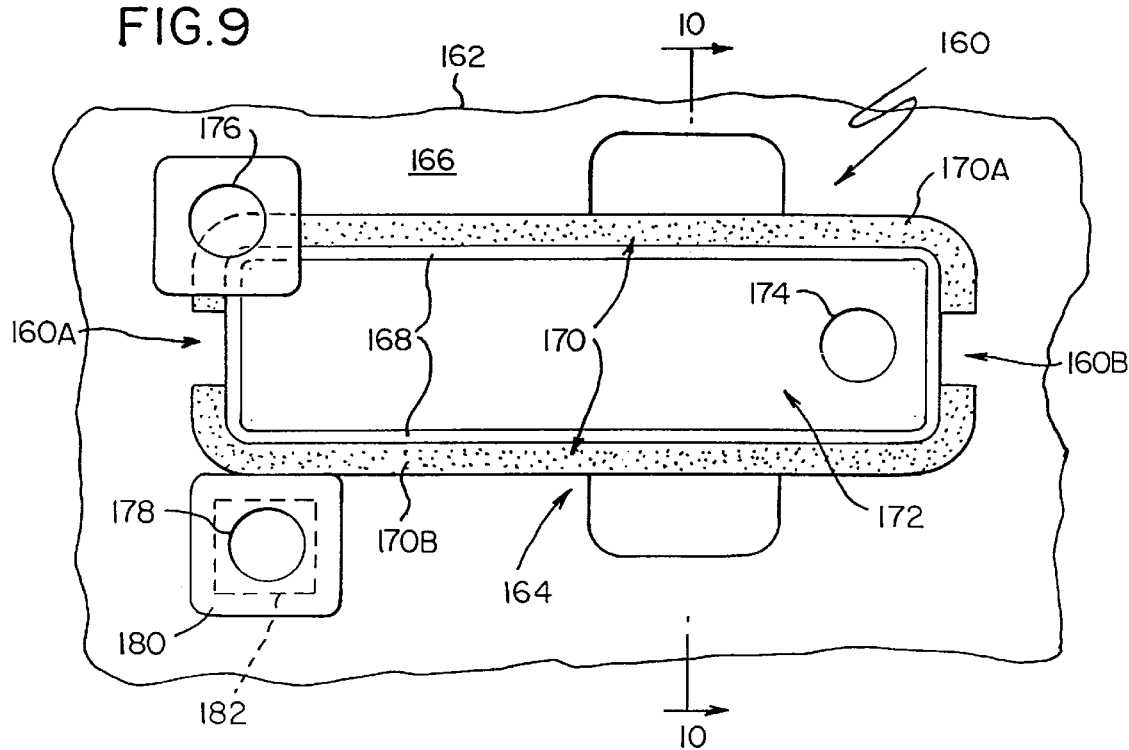
FIG. 9 is a fragmentary plan view illustrating a third embodiment of an improved transistor made in accordance with the present invention.
Figure 10:
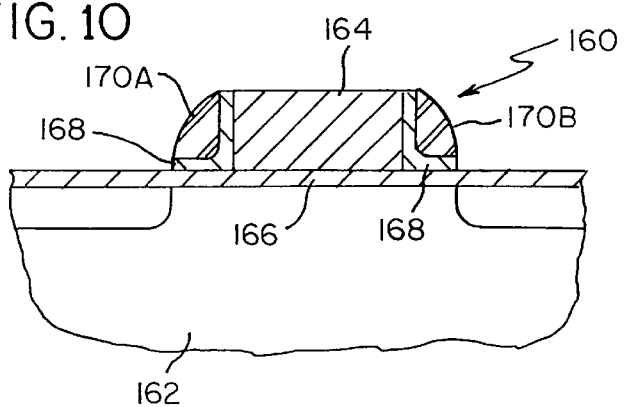
FIG. 10 is a fragmentary sectional view of the improved transistor of FIG. 9 taken along section line 10—10.

A third embodiment of a multiple gate transistor of the present invention is illustrated in FIGS. 9 and 10. In particular, a three gate transistor 160 is formed on a base layer or semiconductor structure 162 which can be one or more semiconductor layers or structures and includes active or operable portions of semiconductor devices. The semiconductor structure 162 is formed of silicon in the illustrated embodiment although the invention is applicable to other semiconductor materials. A gate structure 164 is formed on a first oxide layer 166 formed on the semiconductor structure 162. The gate structure 164 is illustrated as a polysilicon gate; however, other gate structures can be used and are considered to be within the scope of the present invention.

A secondary oxide layer 168 is formed on the gate structure 164. The secondary oxide layer 168 may be formed, for example, by a chemical vapor deposition (CVD) of tetraethyl orthosilicate (TEOS) or rapid thermal processor (RTP) oxide (RTO). A conductive gate spacer 170 is formed, for example from $TiSi_2$, around the gate structure 164 on the secondary oxide layer 168. The conductive gate spacer 170 and the secondary oxide 168 are then removed to the top of the gate structure 164 and to the first oxide layer 166 elsewhere. Removal of the conductive gate spacer 170 and the secondary oxide 168 over the gate structure 164 forms an opening or aperture 172 in the spacer 170 and the secondary oxide 168 through which the gate structure 164 can be contacted. The gate spacer 170 and secondary oxide 168 are also removed to the first oxide layer 166 or not formed originally at a first end 160A and at a second end 160B of the transistor 160 leaving a first portion 170A of the spacer 170 on a first side of the gate structure 164 on the secondary oxide layer 168 and a second portion 170B of the spacer 170 on a second side of the gate structure 164 on the secondary oxide layer 168.

In the transistor 160, the gate structure 164 defines a first gate for the transistor 160, the first portion 170A of the conductive spacer 170 defines a second gate for the transistor 160 and the second portion 170B of the conductive spacer 170 forms a third gate for the transistor 160. While a conductive spacer is illustrated in FIGS. 9 and 10, it is noted that if the portion of the spacer adjacent to the secondary oxide layer is conductive, that conductive portion of the spacer will form the second and third gates for the transistor 160 in accordance with the above disclosure relating to the composite spacer of FIGS. 7 and 8.

A first contact is made to the gate structure 164, for example at a contacting area 174. A second contact is made to the first portion 170A the conductive spacer 170 at a contacting area 176, or to the conductive portion of the spacer if a composite spacer is used. And, a third contact is made to the second portion 170B of the spacer 170 at a contacting area 178, or to the conductive portion of the spacer if a composite spacer is used. As illustrated, contact is made to the portion 170A of the spacer 170 using conductive spacer material which extends over the field oxide and the polysilicon gate and contact is made to the portion 170B of the spacer 170 using conductive spacer material which connects to a neighboring spacer 180 formed over a spacer support formed by a pseudo gate or polysilicon pad 182. However, the first, second and third contacts can be made using a variety of known techniques.

Figure 11:
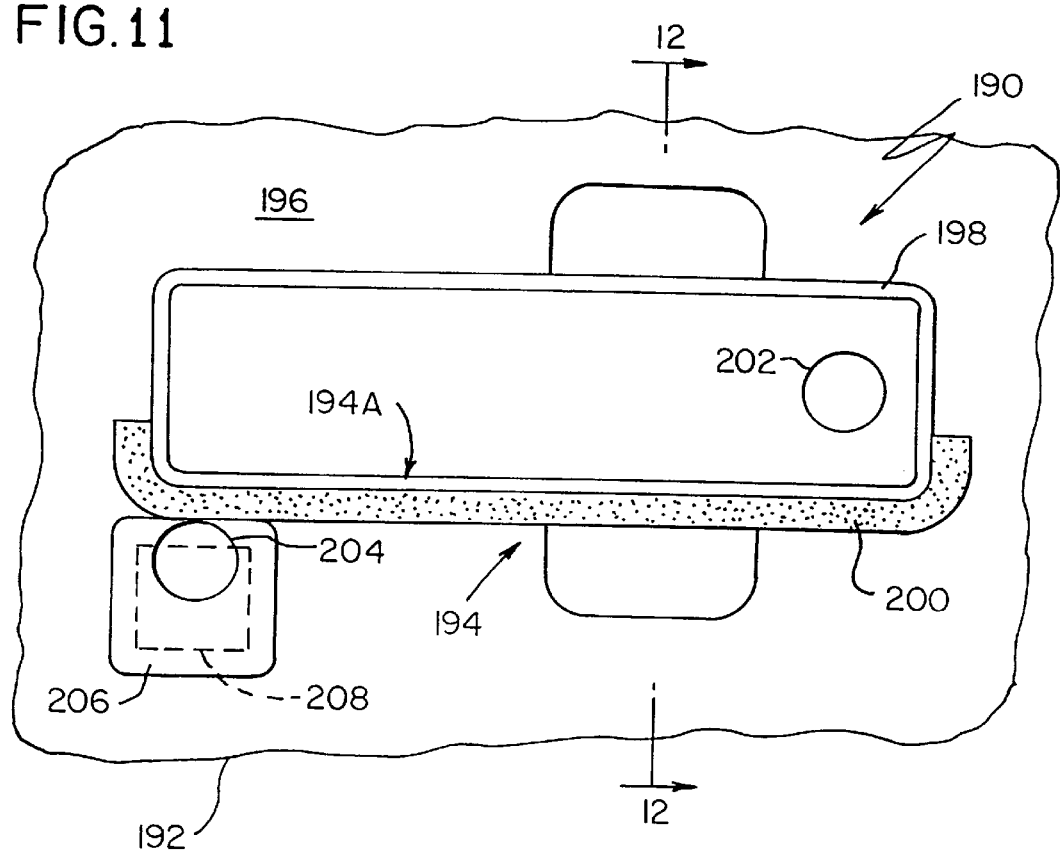
FIG. 11 is a fragmentary plan view illustrating a fourth embodiment of an improved transistor made in accordance with the present invention.
Figure 12:
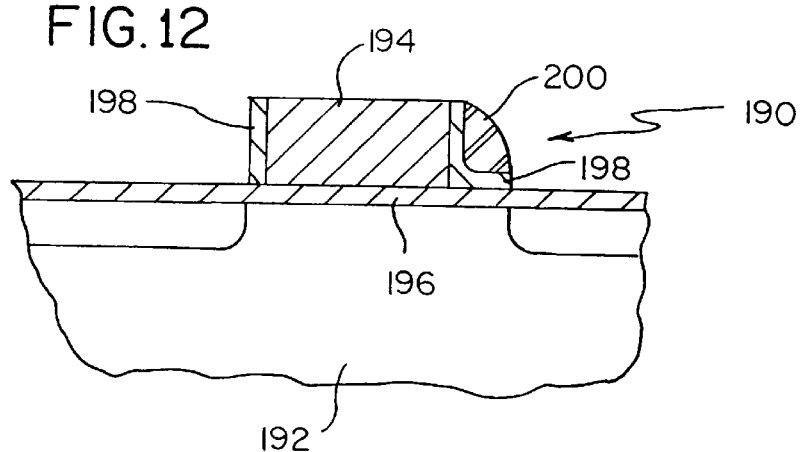
FIG. 12 is a fragmentary sectional view of the improved transistor of FIG. 11 taken along section line 12—12.

A fourth embodiment of a multiple gate transistor of the present invention is illustrated in FIGS. 11 and 12. In particular, a two gate transistor 190 is formed on a base layer or semiconductor structure 192 which can be one or more semiconductor layers or structures and includes active or operable portions of semiconductor devices. The semiconductor structure 192 is formed of silicon in the illustrated embodiment although the invention is applicable to other semiconductor materials. A gate structure 194 is formed on a first oxide layer 196 formed on the semiconductor structure 192. The gate structure 194 is illustrated as a polysilicon gate; however, other gate structures can be used and are considered to be within the scope of the present invention.

A secondary oxide layer 198 is formed on the gate structure 194. The secondary oxide layer 198 may be formed, for example, by a chemical vapor deposition (CVD) of tetraethyl orthosilicate (TEOS) or rapid thermal processor (RTP) oxide (RTO). A conductive gate spacer 200 is formed, for example from $TiSi_2$, on one side 194A of the gate structure 194 on the secondary oxide layer 198. The top of the gate structure 194 is open for making contact to the gate structure, for example at a contact area 202.

In the transistor 190, the gate structure 194 defines a first gate for the transistor 190 and the conductive gate spacer 200 defines a second gate for the transistor 190. While a conductive spacer is illustrated in FIGS. 11 and 12, it is noted that if the portion of the spacer adjacent to the secondary oxide layer is conductive, that conductive portion of the spacer will form the second gate for the transistor 190 in accordance with the above disclosure relating to the composite spacer of FIGS. 7 and 8.

A first contact is made to the gate structure 194, for example at the contact area 202. A second contact is made to the conductive spacer 200, for example at a contact area 204, or to the conductive portion of the spacer if a composite spacer is used. As illustrated, contact is made to the conductive spacer 200 using conductive spacer material which connects to a neighboring spacer 206 formed over a spacer support formed by a pseudo gate or polysilicon pad 208 with the contact area 204 straddling the spacer 206. It is to be understood that the contacts can be made at a number of different locations and using a variety of known techniques. Methods of making the transistor embodiments of FIGS. 7–12 are apparent from the foregoing description and the above description made relative to the embodiments of FIGS. 1–3.

Having, thus, described the invention of the present application in detail and by reference to preferred embodiments thereof, it will be apparent that modifications and variations are possible without departing from the scope of the invention defined in the appended claims.

What is claimed is:

1. A transistor structure comprising:

a gate structure formed on a first oxide layer on a semiconductor structure;

a secondary oxide layer formed on said gate structure;

a conductive spacer formed around said gate structure on said secondary oxide layer, said conductive spacer including an aperture over a portion of said gate structure;

a first contact to said gate structure by way of said aperture; and a second contact to said conductive spacer.

2. A dual gate transistor structure comprising:

a gate structure formed on a first oxide layer on a semiconductor structure and defining a first gate;

a secondary oxide layer formed over said gate structure;

a conductive spacer formed around said gate structure on said secondary oxide layer, said conductive spacer defining a second gate and including an aperture over a portion of said gate structure;

a first contact to a portion of said gate structure corresponding to said aperture; and a second contact to said conductive spacer.

3. A transistor structure comprising:

an actual gate and a pseudo gate formed on a first oxide layer on a semiconductor structure, said actual and pseudo gates being separated from one another;

a secondary oxide layer formed over said actual and pseudo gates;

a conductive spacer formed around said actual and pseudo gates on said secondary oxide layer, said conductive spacer including an aperture over a portion of said actual gate;

a first contact to a portion of said actual gate corresponding to said aperture; and a second contact to said conductive spacer at said pseudo gate.

4. An integrated circuit structure comprising:

a first plurality of conventional LDD transistors; and a second plurality of transistors each comprising:

a gate structure formed on a first oxide layer on a semiconductor structure;

a secondary oxide layer formed on said gate structure;

a conductive spacer formed around said gate structure on said secondary oxide layer, said conductive spacer including an aperture over a portion of said gate structure;

a first contact to said gate structure at a portion of said gate structure corresponding to said aperture; and a second contact to said conductive spacer, said first plurality of conventional LDD transistors and said second plurality of transistors being interconnected to form said integrated circuit structure.

5. An integrated circuit structure as claimed in claim 4 wherein said integrated circuit structure includes output drivers comprising at least a portion of said second plurality of transistors.

6. A transistor structure comprising:

a gate structure formed on a first oxide layer on a semiconductor structure;

a secondary oxide layer formed on said gate structure;

a conductive layer formed around said gate structure on said secondary oxide layer, said conductive layer including an aperture over a portion of said gate structure;

a nonconductive spacer formed over said conductive layer, said nonconductive spacer including an aperture at least partially aligned with said aperture through said conductive layer;

a first contact to said gate structure at a portion of said gate structure corresponding to said apertures; and a second contact to said conductive layer.

7. A dual gate transistor structure comprising:

a gate structure formed on a first oxide layer on a semiconductor structure and defining a first gate;

a secondary oxide layer formed over said gate structure;

a conductive layer formed on said secondary oxide on said gate structure, said conductive layer defining a second gate and including an aperture over a portion of said gate structure;

a nonconductive spacer formed over said conductive layer, said nonconductive spacer including an aperture at least partially aligned with said aperture through said conductive layer;

a first contact to said first gate at a portion of said gate structure corresponding to said apertures; and a second contact to said conductive layer.

8. A transistor structure comprising:

a gate structure formed on a first oxide layer on a semiconductor structure;

a secondary oxide layer formed on said gate structure;

a conductive layer formed on said secondary oxide layer on said gate structure, said conductive layer including an aperture over a portion of said gate structure and forming a first conductive portion of a spacer;

a nonconductive layer formed over said conductive layer, said nonconductive layer including an aperture at least partially aligned with said aperture through said conductive layer and forming a second nonconductive portion of said spacer;

a first contact to said gate structure at a portion of said gate structure corresponding to said apertures; and a second contact to said conductive layer.

9. A transistor structure comprising:

a gate structure formed on a first oxide layer on a semiconductor structure;

a secondary oxide layer formed on said gate structure;

a composite spacer formed on said secondary oxide layer on said gate structure, said composite spacer comprising a conductive layer formed over said gate structure and a nonconductive layer formed over said conductive layer, said composite spacer including an aperture over a portion of said gate structure;

a first contact to said gate structure by way of a portion of said gate structure corresponding to said aperture; and a second contact to said conductive layer of said composite spacer.

10. An integrated circuit structure comprising:

a first plurality of conventional transistors;

a second plurality of transistors each comprising:

a gate structure formed on a first oxide layer on a semiconductor structure;

a secondary oxide layer formed on said gate structure;

a spacer formed on at least one side of said gate structure on said secondary oxide layer, at least a portion of said spacer adjacent to said secondary oxide layer being conductive and defining at least a second gate;

a first contact to said gate structure;

at least a second contact to said conductive portion of said spacer, said first plurality of conventional transistors and said second plurality of transistors being interconnected to form said integrated circuit structure; and a third plurality of conventional LDD transistors, said third plurality of conventional LDD transistors being interconnected to said first plurality of said conventional transistors to form said integrated circuit structure.

11. An integrated circuit structure as claimed in claim 10 wherein said third plurality of conventional LDD transistors are interconnected to said second plurality of transistors to form said integrated circuit structure.

12. An integrated circuit structure comprising:

a first plurality of conventional transistors;

a second plurality of transistors each comprising;

a gate structure formed on a first oxide layer on a semiconductor structure;

a secondary oxide layer formed on said gate structure;

a spacer formed on at least one side of said gate structure on said secondary oxide layer, at least a portion of said spacer adjacent to said secondary oxide layer being conductive and defining at least a second gate;

a first contact to said gate structure;

at least a second contact to said conductive portion of said spacer, said first plurality of conventional transistors and said second plurality of transistors being interconnected to form said integrated circuit structure; and a third plurality of conventional LDD transistors, said third plurality of conventional LDD transistors being interconnected to said second plurality of transistors to form said integrated circuit structure.

* * * * *